(12) United States Patent
Rokuhara et al.

(10) Patent No.: US 8,482,107 B2
(45) Date of Patent: Jul. 9, 2013

(54) CIRCULAR SHIELD OF A CIRCUIT-SUBSTRATE LAMINATED MODULE AND ELECTRONIC APPARATUS

(75) Inventors: Shinji Rokuhara, Kanagawa (JP); Shuichi Oka, Kanagawa (JP); Katsuji Matsumoto, Kanagawa (JP); Shusaku Yanagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 124 days.

(21) Appl. No.: 12/926,288

(22) Filed: Nov. 8, 2010

(65) Prior Publication Data
US 2011/0156224 A1 Jun. 30, 2011

(30) Foreign Application Priority Data

Dec. 25, 2009 (JP) ................................. 2009-296070

(51) Int. Cl.
*H01L 23/552* (2006.01)
(52) U.S. Cl.
USPC ............ 257/660; 257/659; 257/508; 174/384

(58) Field of Classification Search
USPC .......................... 257/659, 660, 508; 174/384
See application file for complete search history.

(56) References Cited

U.S. PATENT DOCUMENTS

2009/0072357 A1* 3/2009 Tang et al. ................... 257/659

FOREIGN PATENT DOCUMENTS

| JP | 2002-141707 A | 5/2002 |
| JP | 2006-060029 | 3/2006 |
| JP | 2007-151123 | 6/2007 |
| JP | 2009-059989 | 3/2009 |

* cited by examiner

*Primary Examiner* — Eva Yan Montalvo
(74) *Attorney, Agent, or Firm* — Rader, Fishman & Grauer PLLC (57) ABSTRACT

A device that comprises a plurality of circuit elements on a substrate; a shielding element between at least two of the plurality of circuit elements; and a bonding element that electrically connects the shielding element to a grounding circuit of a semiconductor chip that is on the substrate.

15 Claims, 7 Drawing Sheets

CIRCULAR SHIELD OF A CIRCUIT-SUBSTRATE LAMINATED MODULE AND ELECTRONIC APPARATUS

BACKGROUND OF THE INVENTION

1. Field of the Invention

The present invention relates to a circuit-substrate laminated module composed of a first circuit substrate, a second circuit substrate created on the first circuit substrate, and a semiconductor chip created as a bare chip on the surface of the second circuit substrate. In addition, the present invention also relates to an electronic apparatus having a mother board implemented by a first circuit board that has a structure similar to the structure of the circuit-substrate laminated module.

2. Description of the Related Art

Efforts to reduce the size and thickness of an electronic product and an effort to make an electronic product capable of carrying out advanced functions and operating at high frequencies have made progress. In general, the circuit section of an electronic product is configured to employ a number of semiconductor integrated circuits and a number of circuit components on a printed wiring board referred to as a mother board. In the following description, a semiconductor integrated circuit is also referred to as an IC chip.

Miniaturization of the IC chips composing the electronic product and high-scale integration of the IC chips have also been progressing. For example, the so-called system LSI (Large Scale Integration) conversion, which is described below, has also made progress. In the past, an entire functional block was configured to employ a plurality of IC chips and a plurality of other circuit components on a printed wiring board. By the system LSI conversion, the entire functional block is implemented in a single semiconductor chip.

At the same time, the printed wiring board and components mounted on the board demand capabilities such as high frequency and high speed operations, to have smaller sizes, and integratable on a large scale.

To reduce the size and thickness of the electronic apparatus, it is necessary to mount a plurality of circuit devices including passive devices such as inductors, capacitors, and registers in a small area on the same substrate in addition to the IC chips. To mount such circuit devices in a small area on the same substrate in addition to the IC chips, it is practical to use an SiP (System in Package). The SiP is a package for implementing a plurality of IC chips and a plurality of such passive devices.

In addition, to further reduce the size and thickness of the electronic apparatus, technology development for creating a passive device on a printed wiring board have started. By virtue of this technology, it is possible to reduce the cost of an externally installed component that is difficult to incorporate in an IC chip in the present state of the art. In addition, such an externally installed component may be made in such a way that the component does not serve as a barrier to efforts to reduce the size and thickness of the entire substrate.

Typical examples of the externally installed component, which is difficult to incorporate in an IC chip in the present state of the art, include a capacitor having a large capacitance and an inductor having a large inductance (or a large L value). In particular, an inductor having a large L value is known to entail a number of electromagnetic interferences to circuit devices surrounding the inductor. For more information, the reader is advised to refer to documents such Japanese Patent Laid-Open No. 2006-60029 (hereinafter referred to as Patent Document 4).

If it is necessary to implement a plurality of passive circuit devices such as inductors each having a large L value so as to entail a number of electromagnetic interferences to other circuit devices surrounding the passive circuit device in a small area, the distances between the passive circuit devices become short. Thus, it is necessary to suppress interferences caused by mutual inductances of the passive circuit devices to serve as the interferences between the circuit devices. The interferences caused by mutual inductances to serve as the interferences between the passive circuit devices must be suppressed without regard to whether each of the passive circuit devices have been created by making use of a substrate lamination structure in a circuit substrate or each of the passive circuit devices have been created to serve as an individual component mounted on the surface of the circuit substrate.

As a technique for suppressing interferences between the circuit devices, there is a technique to devise surface implementation locations of chip inductors and laminated inductor components in a filter, an antenna sharing unit, and a communication apparatus. For more information on this technique, the reader is advised to refer to documents such Japanese Patent Laid-Open No. 2002-141707 (hereinafter referred to as Patent Document 1).

In addition, as a technique for implementing a shield of a high-frequency compound module making use of a multi-layer substrate, there is a technique to devise shield electrodes and through holes. For more information on this technique, the reader is advised to refer to documents such Japanese Patent Laid-Open No. 2007-151123 (hereinafter referred to as Patent Document 2).

Also, there is a technology to lay out inductors by avoiding the RF circuit of a signal transmitting/receiving section. For more information on this technology, the reader is advised to refer to documents such Japanese Patent Laid-Open No. 2009-59989 (hereinafter referred to as Patent Document 3).

SUMMARY OF THE INVENTION

The present invention relates to a device that comprises a plurality of circuit elements on a substrate; a shielding element between at least two of the plurality of circuit elements; and a bonding element that electrically connects the shielding element to a grounding circuit of a semiconductor chip that is on the substrate. In addition, the shielding element may electrically form a circular shield. Further, the circular shield may be formed in a direction normal to a plane (substrate lamination direction) constructed by the at least two of the plurality of circuit elements.

DETAILED DESCRIPTION OF THE PREFERRED EMBODIMENTS

In accordance with Patent Document 1, in a filter, an antenna sharing unit and a communication apparatus, chip inductors and laminated inductor components are placed on the same planar surface in such a way that the axial directions of the surface-implemented chip inductors and the surface-implemented laminated inductor components differ by at least 45 degrees. Thus, it is possible to suppress unnecessary electromagnetic couplings between the chip inductors.

Since inductors created on a printed wiring board are generally spiral inductors having planar shapes with a uniform axial direction, however, the axial direction cannot be changed. Thus, the technology disclosed in Patent Document 1 cannot be applied to spiral inductors created on a printed wiring board as an inductor having a planar shape.

Patent Document 2 discloses a typical high-frequency modular component implemented separately from a high-frequency IC chip on a printed wiring board. However, the technology described in this reference cannot be used to implement miniaturization of the entire module including the IC chips and high-scale integration of the module.

In addition, in the typical high-frequency modular component disclosed in Patent Document 2, inside a laminated body composed of a plurality of laminated inductive sheets, a shield electrode and through hole electrodes each placed at a position separated from the position of the shield electrode in the lamination direction are provided in a cascade relation of a planar view at small intervals. Thus, a shield wall structure dividing the module into two portions in the planar view is created. This structure is used as a shield between a high-frequency amplifier and an antenna switch module. It is thus possible to prevent isolation from deteriorating. Without such isolation, a high-frequency component leaking from the high-frequency amplifier will interfere the antenna switch.

In the shield wall structure, however, the size of an area for creating the shield electrode and the numerous through hole electrodes increases. Thus, it is difficult to reduce the size of the module and particularly difficult to decrease the area. In addition, if some shield walls based on through hole electrodes (vias) are created at a small pitch, the degree of freedom to connect circuit components to each other inside the substrate will undesirably be reduced. Such a reduced degree of freedom increases design complexities. From a standpoint that it is necessary to connect circuit components to each other inside the substrate by avoiding the shield wall portions, however, the module area is also increased due to the circuit-component connections which avoid the shield wall portions.

In accordance with Patent Document 3, an RF circuit and an inductor are created on the same substrate. However, the inductor is created on a non-creation area in which the RF circuit is not created. This is a technique of devising a layout for avoiding electromagnetic interferences even without creating a shield structure.

With such a technique, however, there is a limit on the efforts made to avoid electromagnetic interferences. Thus, the disclosed technique cannot be applied to the efforts made in recent years to reduce the size and increase the density.

Addressing the problems described above, inventors of embodiments of the present invention present a circuit-substrate laminated module capable of suppressing interferences between circuit devices such as high-frequency components and reducing the size of a circuit that employs the circuit-substrate laminated module. In addition, the inventors also present an electronic apparatus having a mother board implemented by a first circuit board that has a structure similar to that of the circuit-substrate laminated module.

One embodiment is a device that comprises a plurality of circuit elements on a substrate; a shielding element between at least two of the plurality of circuit elements; and a bonding element that electrically connects the shielding element to a grounding circuit of a semiconductor chip that is on the substrate. In this embodiment, an additional bonding element may electrically connect the grounding circuit of the semiconductor chip to an additional substrate through a via in the substrate. Further, a second additional bonding element may electrically connect the grounding circuit to the additional substrate through a second via in the substrate. Furthermore, the bonding element may physically connect to the grounding circuit is a different location than where the additional bonding element physically connects to the grounding circuit.

In another embodiment of the above mentioned device, the additional bonding element may electrically connect the grounding circuit of the semiconductor chip to an additional substrate through a via in the semiconductor chip and a via in the substrate. Further, a second additional bonding element may electrically connect the grounding circuit to the additional substrate through a second via in the semiconductor chip and a second via in the substrate. Furthermore, the bonding element may physically connect to the grounding circuit is a different location than where the additional bonding element physically connects to the grounding circuit.

In another embodiment of the above mentioned device, the grounding circuit of the semiconductor chip may be on a surface of the semiconductor chip and may border the edges of that surface. Further, the grounding circuit of the semiconductor chip may comprises a trunk line that borders the surface of the semiconductor chip and a branch line that electrically connects the grounding circuit to a plurality of circuit elements in the semiconductor chip. Furthermore, the bonding element may physically connect to the trunk line of the grounding circuit; the branch line may branch from trunk line; the semiconductor chip may comprise an integrated circuit that has an internal via connected to the branch line where the internal via may have an end surface on a side of the semiconductor chip opposite to the a side of the semiconductor chip with the grounding circuit; and a via in the substrate may connect to the end surface of an internal via through a bump to tip arrangement.

In another embodiment of the above mentioned device, the shielding element may electrically form a circular shield. Further, the circular shield may be formed in a direction normal to a plane (a substrate lamination direction) constructed by the at least two of the plurality of circuit elements.

In another embodiment of the above mentioned device, at least on of the circuit elements may be an inductor. Further, the inductor may be a coil line pattern created in a wiring layer of the substrate. Furthermore, the inductor may be a plurality of coil line patterns created in a plurality of wiring layers of the substrate connected by though holes in the substrate.

In another embodiment of the above mentioned device, the bonding element may physically connect to a one end portion of a shielding element.

In another embodiment of the above mentioned device, the shielding element may be a shielding wire.

In another embodiment of the above mentioned device, the bonding element may be a bonding wire.

Another embodiment is a device that comprises a plurality of circuit elements on a substrate; and a shielding element between at least two of the plurality of circuit elements, wherein the shielding element electrically forms a circular shield.

Another embodiment is a tuning circuit that comprising a front-end integrated chip that comprises of at least one of a filter amplifier pair, which comprises a band pass filter and a radio frequency amplifier; and a device that comprises a plurality of circuit elements on a substrate; a shielding element between at least two of the plurality of circuit elements; and a bonding element that electrically connects the shielding element to a grounding circuit of a semiconductor chip that is on the substrate.

Another embodiment is an electronic apparatus that comprises a device, which comprises a plurality of circuit elements on a substrate; a shielding element between at least two of the plurality of circuit elements; and a bonding element that electrically connects the shielding element to a grounding circuit of a semiconductor chip that is on the substrate. Further, the electronic apparatus may be a display device and that display device may be a TV. Furthermore, the electronic apparatus may comprise tuning circuit, which may have a front-end integrated chip that includes the device, that comprises of at least one of a filter amplifier pair, which may be a band pass filter and a radio frequency amplifier.

Another embodiment is a method for manufacturing a device that comprises forming a plurality of circuit elements on a substrate and a shielding element between at least two of the plurality of circuit elements; bonding a shielding element to a grounding circuit of a semiconductor chip that is on the substrate by a bonding element; and electrically forming a circular shield in a direction normal to a plane constructed by the at least two of the plurality of circuit elements.

In accordance with embodiments of the present invention, it is possible to provide a circuit-substrate laminated module that is capable of suppressing mutual interferences among circuit devices such as high-frequency components and has a small size. In addition, in accordance with embodiments of the present invention, it is possible to provide an electronic apparatus including a mother board implemented by a first circuit board that has a structure similar to that of the structure of the circuit-substrate laminated module.

Thus, the circular shield of the circuit-substrate laminated module according to embodiments of the present invention is provided for reducing mutual electromagnetic interferences among a plurality of circuit devices employed in the circuit-substrate laminated module. In this case, a circuit device is defined as a device causing mutual electromagnetic interferences in conjunction with other surrounding circuit devices. A typical example of the circuit device is a passive device. The passive devices include a capacitor having a large capacitance and an inductor having a large inductance (or a large L value). In particular, an inductor having a large L value is known to entail a number of large electromagnetic interferences to circuit devices surrounding the inductor. Preferred embodiments of the present invention are explained in chapters that are arranged in the following order:

1: Module Cross-Sectional Structure (Typical Structure of the Circuit-Substrate Laminated Module)
2: Typical Frequency Circuit
3: Inductor Coupling Coefficient
4: Circular Shield in the Substrate Lamination Direction
5: Typical Product Serving as an Application 1: Module Cross-Sectional Structure FIG. 1 is a diagram roughly showing a cross section of a circuit-substrate laminated module 1 according to an embodiment of the present invention.

Figure 1:
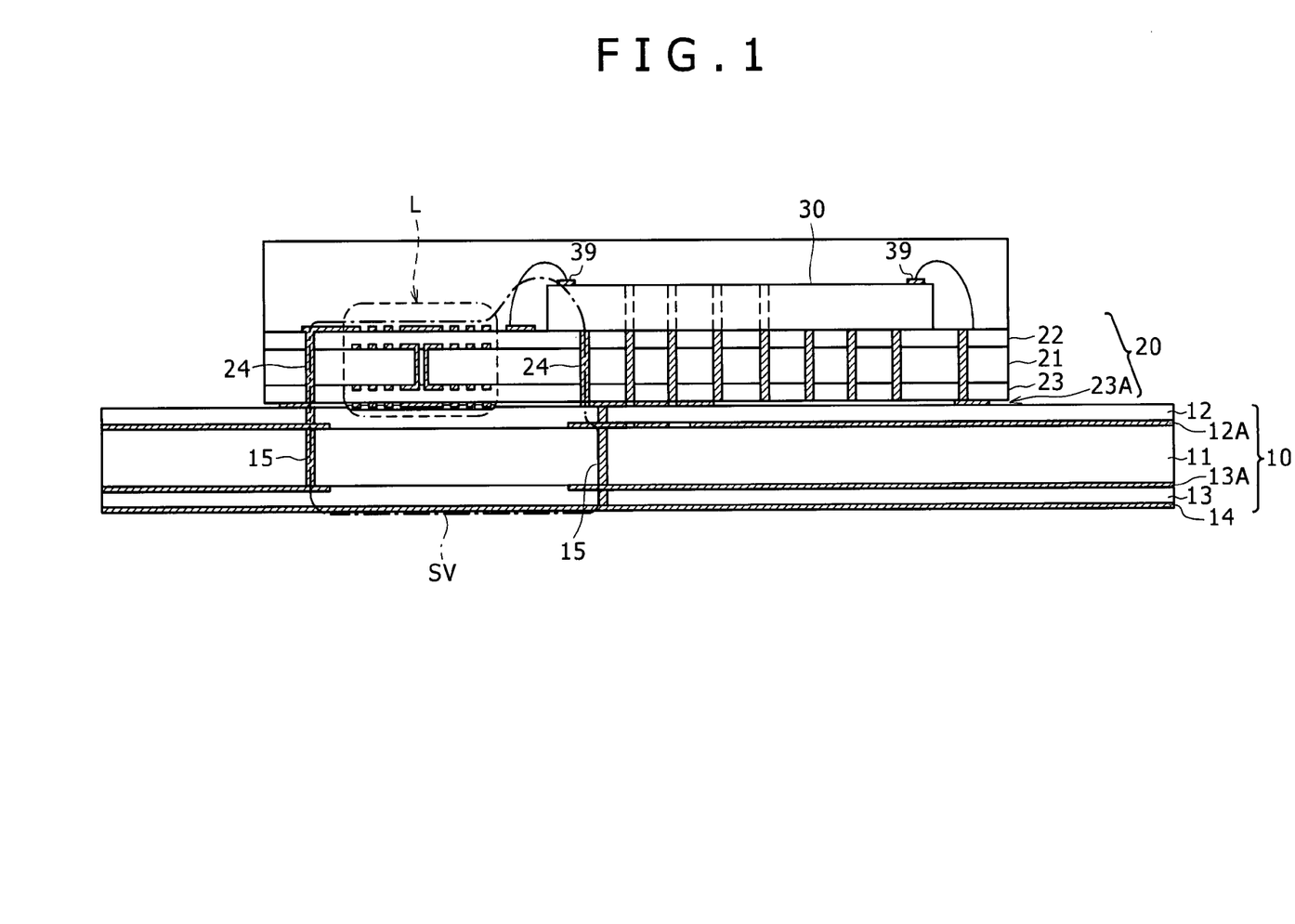
FIG. 1 is a cross sectional diagram of a circuit-substrate laminated module according to an embodiment of the present invention.

The circuit-substrate laminated module 1 shown in the cross-sectional diagram of FIG. 1 employs two main sections, i.e., a first circuit substrate 10 and a second circuit substrate 20 which is laid on typically one of the principal surfaces of the first circuit substrate 10.

The first circuit substrate 10 has a core substrate 11. A wiring layer 12A is created on the upper surface of the core substrate 11 whereas a wiring layer 13A is created on the lower surface of the core substrate 11.

On the wiring layer 12A created on the upper surface of the first circuit substrate 10, an insulation layer 12 is pasted. By the same token, beneath the wiring layer 13A created on the lower surface of the first circuit substrate 10, an insulation layer 13 is pasted.

The insulation layer 12 has a surface on a side opposite to the core substrate 11. On this opposite side, a conductive film serving as typically a copper-foil wire is created in advance. Then, by carrying out a patterning process on the conductive film, a wiring layer is created.

It is to be noted that the wiring layer created on the opposite side for the insulation layer 12 is not shown in the cross-sectional diagram of FIG. 1.

By the same token, the insulation layer 13 has a surface on a side opposite to the core substrate 11. On this opposite side, a conductive film serving as typically a copper-foil wire is created in advance. Then, by carrying out a patterning process on the conductive film, a wiring layer is created.

The wiring layer 13A is created as a conductive layer that occupies a relatively large area on the lower surface of the core substrate 11. Since this conductive layer is a ground layer holding a ground electric potential, in the following description, the wiring layer 13A is also referred to as a ground layer that is denoted by the same reference, numeral 13A.

The first circuit substrate 10 shown in the cross-sectional diagram of FIG. 1 includes a multi-layer wiring structure, which has the so-called build-up type. The multi-layer wiring structure having the build-up type is created as a stack of four wiring layers that are built up one after another sequentially in the upward direction. The wiring layer at the bottom of the multi-layer wiring structure having the build-up type is a wiring layer 14 which is created on the lower surface of the insulation layer 13. On the other hand, the wiring layer at the top of the multi-layer wiring structure having the build-up type is a wiring layer created on the top surface of the circuit-substrate laminated module. This wiring layer created on the top surface of the circuit-substrate laminated module is not shown in the cross-sectional diagram of FIG. 1. It is to be noted, however, that the number of wiring layers of the multi-layer wiring structure having the build-up type is not limited to four. That is to say, the number of wiring layers of the multi-layer wiring structure having the build-up type can be any number as long as the number of wiring layers of the multi-layer wiring structure is not smaller than two. If more than four wiring layers of the multi-layer wiring structure having the build-up type are to be created, however, it is necessary to create the additional wiring layers as follows. As described above, the insulation layer 12 has a surface on a side opposite to the core substrate 11. On this opposite side, a conductive film serving as typically a copper-foil wire is created in advance. By the same token, the insulation layer 13 has a surface on a side opposite to the core substrate 11. On this opposite side, a conductive film serving as typically a copper-foil wire is created in advance. In either case, a layer referred to as the ground layer is a wiring layer that holds the electric potential of the ground in the multi-layer wiring structure having the build-up type and has a planar shape with a relatively large area.

The patterning process is carried out by adoption of a plating method based on the plating technology or another conductive-layer creation technology. The patterning process is carried out by adoption of either the non-electrolytic plating method or the electrolytic plating method. On the other hand, a typical method based on the other conductive-layer creation technology is an etching method making use of a resist pattern, which is created by aligning a two-surface mask.

The cross-sectional diagram of FIG. 1 does not show a substrate penetration via of the first circuit substrate 10. In a process of creating a substrate penetration via on the core substrate 11, prior to a process to create the wiring layers 12A and 13A, the via is created in advance by adoption of a drilling technique or a laser fabrication technique. If the wiring layers 12A and 13A are created by adoption of the electrolytic plating method, the internal wall of the via is veiled by a thin conductive film that is demanded in the process of creating the wiring layers 12A and 13A. Then, by carrying out a plating growth process on the inside of the via, the substrate penetration via is created. If the thin conductive film cannot be embedded in the via by adoption of the plating technology, it is necessary to carry out a process of embedding another conductive film.

It is to be noted that a substrate penetration via on an insulation substrate can also be created by similar techniques. However, the process of creating a substrate penetration via on an insulation substrate is not described in detail.

Some substrate penetration vias are used for taking out an electrode of a passive device inside a substrate and connecting such passive devices to each other. In addition, some other substrate penetration vias are used for connecting ground wires to each other. A typical example of the substrate penetration via used for connecting ground wires to each other is denoted by reference numeral 15 in the cross-sectional diagram of FIG. 1. By making use of the first-substrate penetration via 15 for connecting the ground layer 13A to a ground wiring layer inside the first circuit substrate 10 and the ground wiring layer on the top surface of the first circuit substrate 10, these ground wiring layers can be sustained at almost electrically the same electric potential, which is the ground electric potential.

On one of the principal surfaces of the first circuit substrate 10 having the structure described above, typically, the second circuit substrate 20 serving as a circuit-substrate laminated module other than the first circuit substrate 10 is laid. The second circuit substrate 20 has a principal upper surface on a side opposite to the first circuit substrate 10. On this principal upper surface on a side opposite to the first circuit substrate 10, typically, circuit components such as IC chips are mounted. In the circuit-substrate laminated module 1 shown in the cross-sectional diagram of FIG. 1, the circuit components mounted on the principal upper surface on a side opposite to the first circuit substrate 10 are a semiconductor chip 30 and an inductor L.

The first circuit substrate 10 in the structure of the circuit-substrate laminated module 1 described above corresponds to the so-called printed wiring board of an electronic apparatus provided by embodiments of the present invention and they will be described later in detail. The printed wiring board of the electronic apparatus is generally referred to as a mother board. In the electronic apparatus, a second circuit board 20 is inserted into a space between a group of electronic components composing an electronic circuit and the printed wiring board serving as the mother board. In order to distinguish the second circuit board 20 from the printed wiring board serving as the mother board, the second circuit board 20 is generally referred to as an interposer.

The second circuit board 20 serving as the interposer in the electronic apparatus has a basic structure similar to that of the first circuit substrate 10, which corresponds to the mother board. The first circuit substrate 10 is also referred to as a build-up type circuit substrate.

As shown in this figure, the second circuit substrate 20 has a core substrate 21. On the upper surface of the core substrate 21, a wiring layer (not shown) in the cross-sectional diagram of FIG. 1 is created. By the same token, on the lower surface of the core substrate 21, another wiring layer (not shown) in the cross-sectional diagram of FIG. 1 is created.

A substrate resin layer serving as an insulation substrate 22 is pasted on the surface of the wiring layer created on the upper surface of the core substrate 21. By the same token, another substrate resin layer serving as a insulation substrate 23 is pasted on the surface of the other wiring layer created on the lower surface of the core substrate 21.

The insulation substrate 22 has a surface on a side opposite to the core substrate 21. On this opposite side, a conductive film serving as typically a copper-foil wire is created in advance. Then, by carrying out a patterning process on the conductive film, a wiring layer (hereinafter referred to as upper wiring layer) is created.

It is to be noted that the wiring layer created on the opposite side for the insulation substrate 22 is not shown in the cross-sectional diagram of FIG. 1.

By the same token, the insulation substrate 23 has a surface on a side opposite to the core substrate 21. On this opposite side, a conductive film serving as typically a copper-foil wire is created in advance. Then, by carrying out a patterning process on the conductive film, a wiring layer is created.

It is to be noted that the wiring layer created on the opposite side for the insulation substrate 23 is not shown in the cross-sectional diagram of FIG. 1.

In the cross-sectional diagram of FIG. 1, the wiring layer created on the insulation substrate 22 and the wiring layer created below the insulation substrate 23 do not include almost all circuit components except the inductor L.

The inductor L is created in the second circuit substrate 20 by connecting a plurality of coil line patterns to each other through the use of through holes penetrating the inside of the second circuit substrate 20 between the upper and lower surfaces of the second circuit substrate 20. The coil line patterns are patterns created in a plurality of wiring layers included in the second circuit substrate 20 in a wiring-layer hierarchical structure.

The inductor L in the circuit-substrate laminated module 1 shown in the cross-sectional diagram of FIG. 1 is created in the second circuit substrate 20 by putting a coil wire in a stack of four wiring layers. The coil wire has been fabricated to have a spiral shape. However, the number of wiring layers is not limited to four and the shape of the fabricated coil wire does not have to be spiral. That is to say, the shape of the fabricated coil wire is not limited to the shape of a curve. Instead, the shape of the fabricated coil wire can be the shape of a square, the shape of a straight line or a combination of the shapes of a curve, a square and a straight line.

It is to be noted that the end wires of the inductor L are not shown in the cross-sectional diagram of FIG. 1. The end wires of the inductor L are electrically connected to predetermined circuit blocks in the semiconductor chip 30 through wire bonds at locations not shown in the cross-sectional diagram of FIG. 1 or through internal wires in the second circuit substrate 20 and connection points on the bottom surface of the semiconductor chip 30.

If the semiconductor chip 30 is a chip that can be provided with an externally attached device having a large size, applications of the present invention are not limited to only an application for implementing the functions, which are provided by the semiconductor chip 30 and the inductor L.

In the case of this embodiment, however, to provide the reader with more concrete and implementable explanation, the semiconductor chip 30 is assumed to be a single chip implementing a portion of a front-end section of a tuner circuit used in an electronic apparatus such as a TV receiver.
2: Typical High-Frequency Circuit In general, to integrate the functions high-frequency circuits such as an oscillator, a filter, a matching circuit, and a modulation circuit in a single package, it is necessary to provide the package with a plurality of inductors and a plurality of capacitors.

In the case of a TV tuner, for example, it is necessary to tune a tuned circuit having a capacitor and an inductor to a desired frequency of a broadcast signal received by an antenna. In addition, it is necessary to tune an inter-stage tuned circuit having a capacitor and an inductor to the frequency of a signal output by a high-frequency amplifier. In the application of the circuit-substrate laminated module 1 to the TV tuner described above, the capacitors can be embedded in the IC chip. In the present state of the art, however, the inductors must be externally connected to the IC chip included in the circuit-substrate laminated module 1.

It is to be noted that, in applications other than the application of the circuit-substrate laminated module 1 to a TV receiver, the circuit-substrate laminated module 1 is applied to high-frequency circuits, such as a modulation circuit, a demodulation circuit, and a local oscillation circuit. Each of the high-frequency circuits demands an inductor. A modulation circuit is a circuit for modulating a baseband signal to generate a radio signal to be transmitted to a portable radio terminal. On the other hand, a demodulation circuit is a circuit for carrying out the inverse function of the modulation circuit. The local oscillation circuit is a circuit for generating a carrier signal used in the modulation process carried out by a modulation circuit and the demodulation process carried out by the demodulation circuit.

Figure 2:
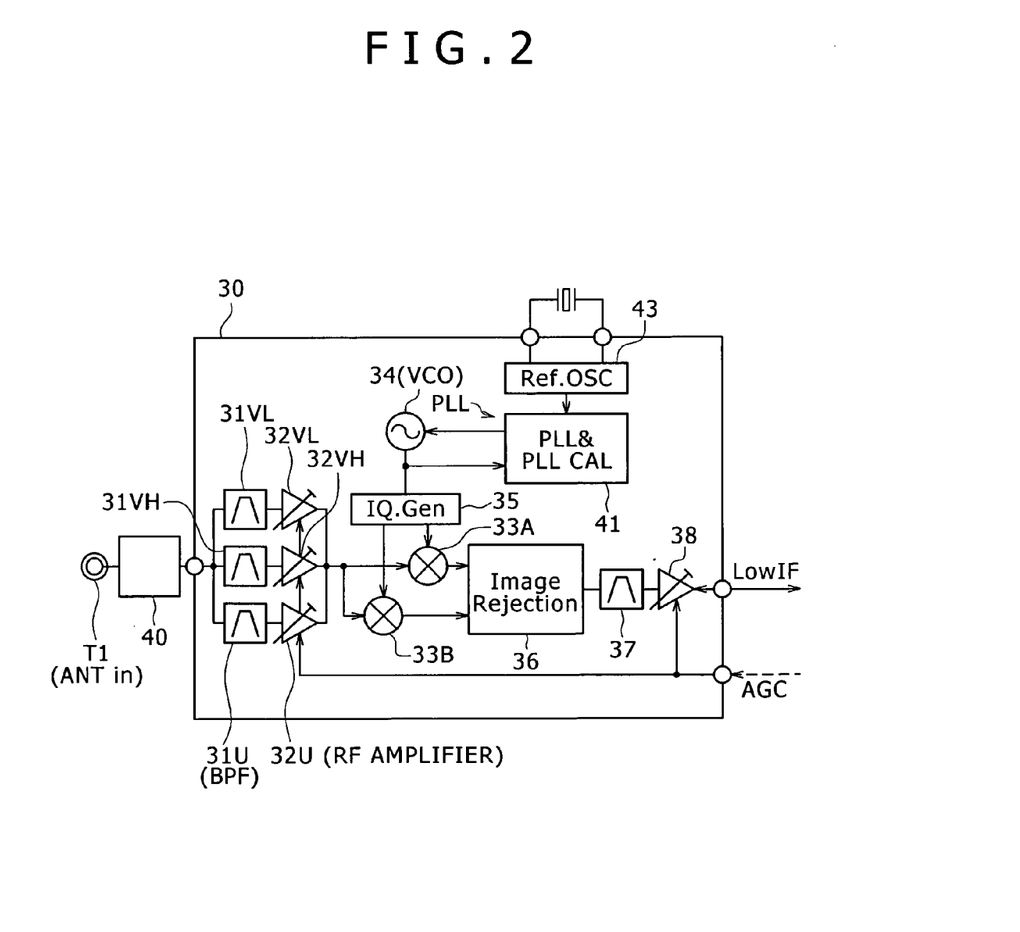
FIG. 2 is a block diagram of a front-end circuit of a TV tuner implemented as a single semiconductor chip.

FIG. 2 is a block diagram showing the configuration of a front-end circuit of a TV tuner implemented as a single semiconductor chip 30. In the following description, the semiconductor chip 30 is also referred to simply as an IC chip.

The frequencies of a radio signal received by the semiconductor chip 30 serving as the tuner front-end IC shown in the block diagram of FIG. 2 are grouped into three frequency bands, i.e., a VL band covering frequencies in the range 46 MHz to 147 MHz, a VH band covering frequencies in the range 147 MHz to 401 MHz, and a U band covering frequencies in the range 401 MHz to 887 MHz. These frequency bands are bands used in TV broadcasting in every country.

The semiconductor chip 30 serving as the tuner front-end IC includes three filter-amplifier pairs each consisting of a BPF (Band Pass Filter) 31 and an RF (Radio Frequency) amplifier 32 for, respectively, the three frequency bands of the input radio signal. To put it more concretely, for the VL band, the semiconductor chip 30 includes a pair, which consists of a BPF 31VL, and an RF amplifier 32VL. For the VH band, the semiconductor chip 30 includes a pair, which consists of a BPF 31VH, and an RF amplifier 32VH. For the U band, the semiconductor chip 30 includes a pair, which consists of a BPF 31U, and an RF amplifier 32U. The three filter-amplifier pairs each consisting of a BPF (Band Pass Filter) 31 and an RF (Radio Frequency) amplifier 32 are connected to an input node in parallel.

The band pass filter 31 provided for a frequency band is configured to employ a capacitor and an inductor that are used for selecting an input signal that has a desired frequency in the band. The capacitor and an inductor are not shown in the block diagram of FIG. 2. The inductor is an externally installed circuit component, which is externally connected to the semiconductor chip 30.

The signal receiving section described above has a mechanism for grouping the frequencies of the input radio signal into three frequency bands by making use of a simplified circuit instead of adopting a signal receiving method utilizing a tuned circuit based on a variable-capacitance diode, an RF amplifier, and an inter-stage tuned circuit for every frequency band. For each of the frequency bands, the simplified circuit demands a tuned circuit based on a variable capacitance and an inductor having a relatively large L value. To apply embodiments of the present invention to the tuned circuit of the simplified circuit, the configuration of embodiments of the present invention is changed to one that is applicable to the tuned-circuit method based on this simplified circuit. In this case, a mechanism needs to be provided to serve as a mechanism for storing the variable capacitance as digital data in a memory.

It is to be noted that, as shown in the block diagram of FIG. 2, a balun 40 serving as a component separated from the semiconductor chip 30 is provided between an antenna terminal T1 and the input node. The balun 40 is a phase matching device for impedance adjustment. In addition, at the front-end stage of the IC chip, an antenna switch not shown in the block diagram of FIG. 2 is provided. The antenna switch not shown in the block diagram of FIG. 2 is used for selecting one of the three circuit pairs provided for the three frequency bands respectively to serve as pairs each consisting of a BPF (band pass filter) and an RF amplifier. The selected pair is then used for processing the input signal that is supplied by the antenna to the semiconductor chip 30 by way of the balun 40.

At a later stage of the semiconductor chip 30 employed in the signal receiving section, two mixers (that is, mixers 33A and 33B) are provided for carrying out a frequency down conversion process on the input signal, which is received from the antenna, by mixing a local oscillation signal with the input signal. In addition, the semiconductor chip 30 also employs a VCO (Voltage Controlled Oscillator) 34 and an IQ generation section 35 for splitting an oscillation signal output by the VCO 34 into I and Q oscillation signals to be supplied to the mixers 33A and 33B respectively. The oscillation signal output by the VCO 34 is split into the I and Q oscillation signals, which have their phases shifted from each other by 90 degrees, by dividing the frequency of the oscillation signal output by the VCO 34.

At a stage following the two mixers 33A and 33B, an image rejection section 36, a filter 37 and an IF (Intermediate Frequency) amplifier 38 are connected to the mixers 33A and 33B in series. The filter 37 is a filter for removing noises. The gains of the IF amplifier 38 and the RF amplifiers 32 each provided for one of the three frequency bands can each be controlled by making use of a signal generated by a source external to the semiconductor chip 30.

The VCO 34 and a circuit for carrying out PLL (Phase-Locked Loop or Phase Lock Loop) control form a PLL. The circuit for carrying out PLL control includes a PLL control circuit 41 and an oscillation circuit 43.

The VCO 34 is an oscillator for generating an oscillation signal having a frequency that is determined by a DC control voltage applied by the PLL control circuit 41 to the VCO 34.

The PLL control circuit 41 employs a frequency divider that is embedded in the PLL control circuit 41 to serve as a frequency divider for dividing the frequency of the oscillation signal generated by the VCO 34. The PLL control circuit 41 also employs a phase comparator which is embedded in the PLL control circuit 41 to serve as a phase comparator for comparing the phase of a signal output by the frequency divider with the phase of an external reference signal supplied to the PLL control circuit 41 by the oscillation circuit 43. The comparison result representing the difference between the phase of the signal output by the frequency divider and the phase of the external reference signal is supplied to a loop filter which is also embedded in the PLL control circuit 41 to serve as a filter for generating the aforementioned DC control voltage to be applied to the VCO 34. Since the frequency of the signal output by the frequency divider is a predetermined fraction of the frequency of the oscillation signal generated by the VCO 34, the magnitude of the DC control voltage to be applied to the VCO 34 varies in accordance with the difference between the phase of the signal output by the VCO 34 and the phase of the external reference signal. The DC control voltage is applied to the VCO 34 to serve as a voltage for controlling the frequency of the oscillation signal generated by the VCO 34. The oscillation circuit 43 supplies the external reference signal to the PLL control circuit 41 to serve also as a control signal for controlling a control block of the loop filter. The oscillation circuit 43 generates the external reference signal on the basis of an oscillation signal generated by an external crystal oscillator, which is externally attached to the semiconductor chip 30.

3: Inductor Coupling Coefficient

Figure 3:
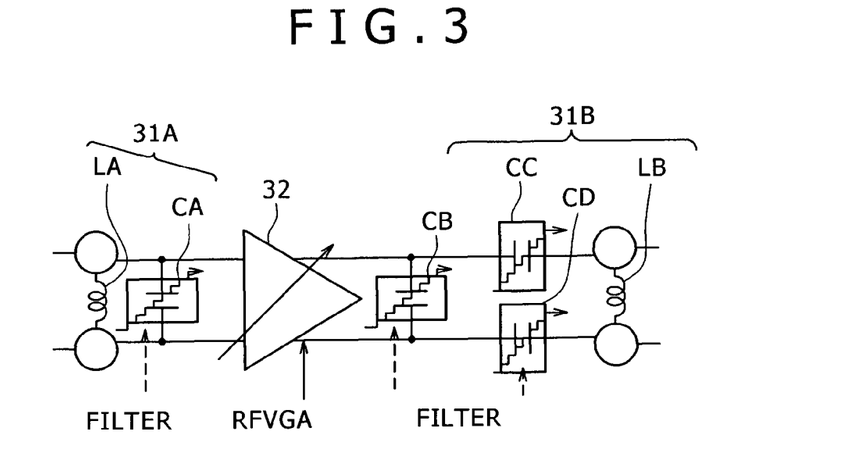
FIG. 3 is a block diagram of a filter circuit portion to be tuned to a desired frequency by adoption of a tuned-circuit method.

FIG. 3 is a block diagram showing a filter circuit portion to be tuned to a desired frequency by adoption of a UHF tuned-circuit method provided for the U band.

The filter circuit portion shown in the block diagram of FIG. 3 is configured to employ a tuned-circuit 31A, a high-frequency amplifier 32 and an inter-stage tuned-circuit 31B. The tuned-circuit 31A has a variable-capacitance capacitor CA and an inductor LA. The inter-stage tuned-circuit 31B includes a filter and an inductor LB. The filter employs capacitors CB, CC and CD.

Input signals received by the antenna include a broadcast signal. The tuned-circuit 31A having the variable-capacitance capacitor CA and the inductor LA is tuned to the frequency of a desired broadcast signal by changing the capacitance of the variable-capacitance capacitor CA. This input broadcast signal is amplified by the high-frequency amplifier 32 and a voltage gain amplifier 32A, which is not shown in the block diagram of FIG. 3. A signal obtained as a result of the amplifications is supplied to the inter-stage tuned-circuit 31B including the inductor LB and the filter, which has three capacitors, i.e., the capacitors CB, CC and CD. At that time, the inter-stage tuned-circuit 31B is tuned to the frequency of the signal supplied thereto. Even though the capacitors CA to CD are embedded in the semiconductor chip 30, the inductors LA and LB are externally connected to the filter circuit portion as inductors provided externally to the semiconductor chip 30.

If the inductors LA and LB are connected to the filter circuit portion as inductors provided externally to the semiconductor chip 30 interfere each other, the characteristic of the filter circuit portion deteriorates and, in addition, the gain characteristics of the high-frequency amplifier 32 and the voltage gain amplifier 32A also worsen as well.

The linearity of each of the gain characteristics also deteriorates for the VL and VH bands in a way similar to the deteriorations described above as deteriorations in the U band.

Figure 4:
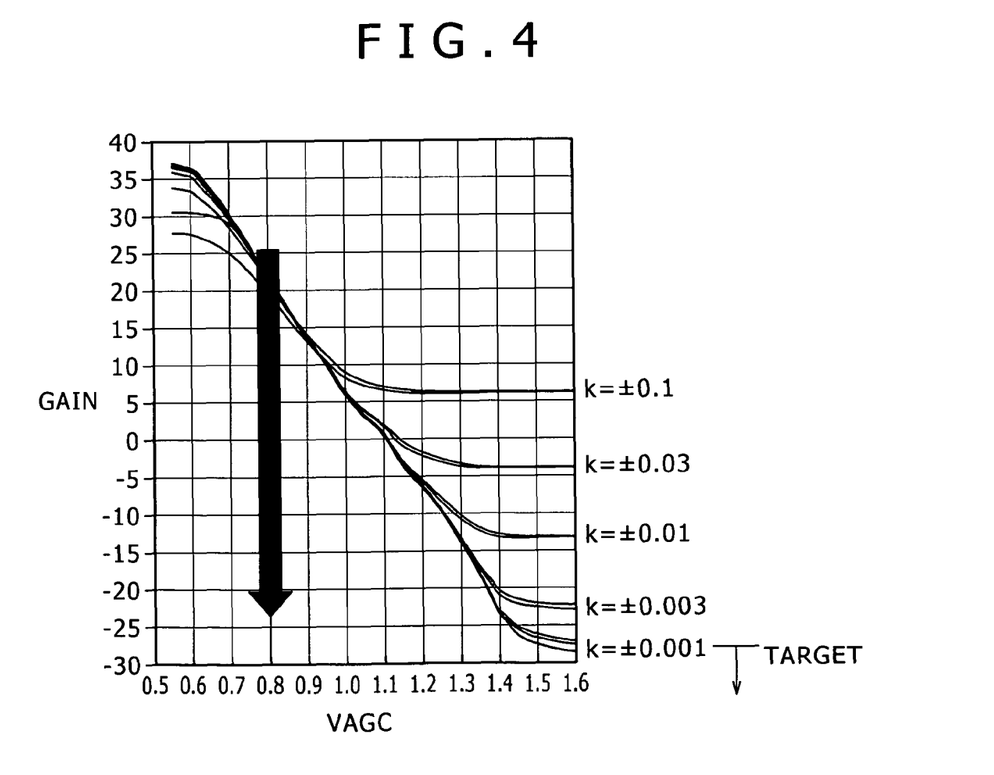
FIG. 4 is a diagram of graphs each serving as a gain characteristic representing a result of simulation carried out to examine how the gain of an RF amplifier varies due to a control voltage applied to the RF amplifier for a variety of inductor coupling coefficients between inductors.

FIG. 4 is a diagram showing graphs, each serving as a gain characteristic representing a result of simulation carried out to examine how the gain of an RF amplifier varies due to changes of a control voltage VAGC supplied to the RF amplifier for a variety of inductor coupling coefficients k between inductors. In this case, the RF amplifier is the high-frequency amplifier 32 described above.

The high-frequency amplifier 32 operates to reduce the output gain for a high level of a broadcast signal received from the antenna so that the level of the signal supplied to the mixers 33A and 33B is adjusted to an optimum level. To be more specific, the high-frequency amplifier 32 reduces the output gain when the control voltage VAGC supplied to the high-frequency amplifier 32 increases. Ideally, when the control voltage VAGC supplied to the high-frequency amplifier 32 increases, the high-frequency amplifier 32 should linearly reduce the output gain. In actuality, however, the reduction of the output gain is known to enter a saturated state in the course of the gain reduction process due to a saturation characteristic of the high-frequency amplifier 32 itself and the effect of a component provided at the stage following the high-frequency amplifier 32.

The simulation results shown in the diagram of FIG. 4, the reduction of the output gain enters a saturated state at a certain magnitude of the control voltage VAGC supplied to the high-frequency amplifier 32 and this certain magnitude of the control voltage VAGC supplied to the high-frequency amplifier 32 is dependent on an inductor coupling coefficient k between the inductor LA provided on the input side of the filter circuit portion and the inductor LB provided on the output side of the filter circuit portion. The larger the inductor coupling coefficient k, the longer the saturated portion of the graph for the inductor coupling coefficient k. Desired (or target) values of the inductor coupling coefficient k are values not greater than ±0.001 which corresponds to the lowest graph with the shortest saturated portion as shown in the diagram of FIG. 4. An inductor coupling coefficient k having a value greater than ±0.001 by at least one digit indicates that the inductors LA and LB having such a large inductor coupling coefficient k cannot be used in conjunction with the high-frequency amplifier 32 because, with such a large inductor coupling coefficient k, the high-frequency amplifier 32 will enter a saturated state at a small VAGC value as indicated by the upper graphs, causing the characteristic of the high-frequency amplifier 32 to be much obstructed. Thus, with such a large inductor coupling coefficient k, a good characteristic of the high-frequency amplifier 32 cannot be obtained.

Circular Shield in the Planar-Surface Direction

A mutual inductance is generated due to a change of a magnetic field generated between two inductors. When a high-frequency current flows through an inductor, a magnetic field is generated by the inductor through which the high-frequency current is flowing. The magnetic field generated by the inductor causes an induced electromotive force to be generated in each of an inductor and a wire, which are placed at locations in close proximity to the inductor generating the magnetic field. The induced electromotive force generated in each of the inductor and the wire causes an induced current to flow through each of the inductor and the wire respectively. The induced current flows from a circuit to another circuit not isolated particularly from the circuit generating the induced current and becomes an unnecessary interference signal, which raises a problem. Thus, the larger the mutual inductance of two inductors, the larger the induced electromotive force and the larger the quantity of the interference between the two inductors.

Figure 5:
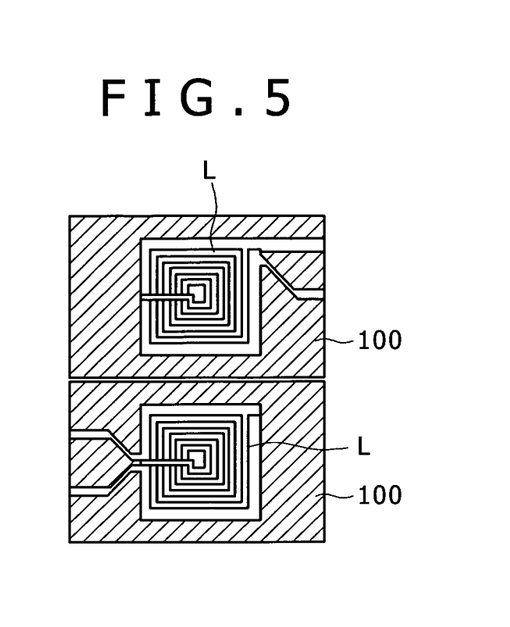
FIG. 5 is a planar diagram of the top view of an inductor structure appearing as a planar pattern enclosed by a bold line and provided with a rectangular contour enclosing a planar inductor to serve as a circular shield oriented in a planar-surface direction.

FIG. 5 is a planar diagram showing the top view of a typical inductor structure appearing as a planar pattern 100 enclosed by a bold line and provided with a rectangular contour enclosing a planar inductor L to serve as a circular shield oriented in a planar-surface direction.

The circular shield oriented in a planar-surface direction is connected to the ground to hold the electric potential of the ground. The area occupied by the inductor component including the circular shield of the planar pattern 100 is large. In addition, due to a magnetic flux emanating from the planar inductor L, an eddy-current loss is incurred in the circular shield. As a result, the characteristic of the planar inductor L deteriorates.

Thus, even if interferences generated by a shield effect between the inductors can be suppressed to a certain degree, the structure shown in the planar diagram of FIG. 5 cannot be adopted as an inductor shield structure of a circuit-substrate laminated module which has a small size.

To suppress interferences generated by an inductor in a high-frequency module mounted on a printed wiring board, including an embedded high-frequency component such as the inductor, it is necessary to take a grounded wire to a state close to an ideal grounded state. The configuration shown in the planar diagram of FIG. 5 to serve as a configuration in which the inductor L is surrounded by the planar pattern 100 enclosed by a bold line is effective for the ideal grounded state.

However, placing a wire occupying a large area in a limited state serves as a hindrance to efforts to reduce the size of the SiP and enhance the scale of the integration. In addition, due to a magnetic flux emanating from the planar inductor L, an eddy-current loss is incurred in the circular shield. As a result, the characteristic of the planar inductor L itself deteriorates inevitably.

Patent Document 4 discloses a technology for solving the problems raised by the shield structure shown in the planar diagram of FIG. 5. In accordance with the technology proposed in Patent Document 4, the inductor is enclosed by a fine wire of a closed circuit to reduce interferences propagating through a mutual inductance.

Figure 6:
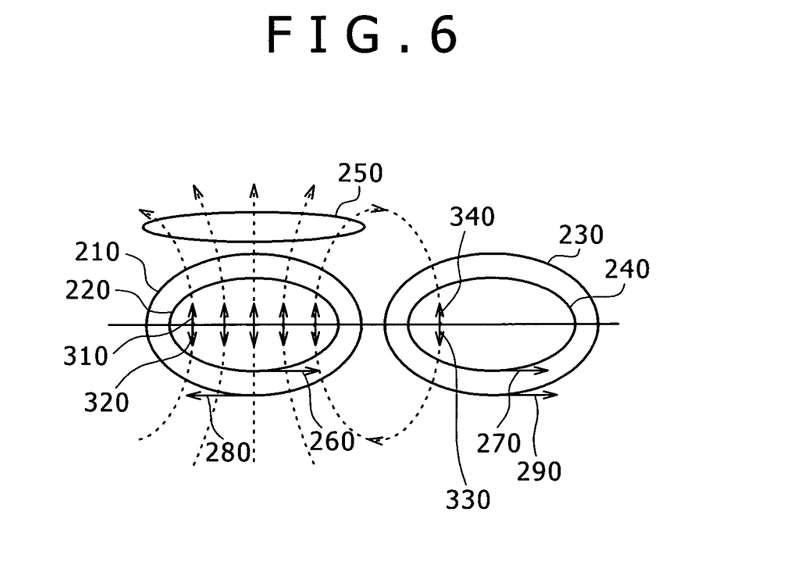
FIG. 6 is an explanatory diagram of effects obtained as a result of shielding every inductor by making use of a fine wire of a planar closed circuit.

FIG. 6 is an explanatory diagram referred to in description of effects obtained as a result of shielding every inductor by making use of a fine wire of a planar closed circuit. A DC voltage (ground voltage) of the ground is applied to the fine wire of the planar closed circuit. Since the wire is fine, however, it is possible to reduce the increase of the consequence of an areal problem to a minimum. Patent Document 4 explains the problem-consequence reduction effects, that is, the interference reduction effects as follows.

The explanatory diagram of FIG. 6 shows circular loops through each of which a current is flowing. In the left diagram, reference numeral 210 denotes a current loop formed by a wire for reducing interferences on the interference-source side whereas reference numeral 220 denotes a current loop formed by an inductor on the interference-source side. In the right diagram, on the other hand, reference numeral 230 denotes a current loop formed by a wire for reducing interferences on the interfered-object side whereas reference numeral 240 denotes a current loop formed by an inductor on the interfered-object side.

If an AC signal current 260 flows through the current loop 220 formed by an inductor on the interference-source side, an AC magnetic field 250 is generated. The direction of the AC magnetic field 250 is determined in accordance with the Biot-Savart law. In accordance with the Biot-Savart law, the direction of the AC magnetic field 250 is a direction 310 in which a right screw is proceeding when the right screw is rotated perpendicularly to a plane, which is created by the current loop 220 formed by an inductor on the interference-source side, in the direction of the AC signal current 260. The magnitude and direction of the AC magnetic field 250 are changed in accordance with changes of the magnitude and direction of the AC signal current 260. The changes of the direction of the AC signal current 260 include the inversion of the direction of the AC signal current 260. By the same token, the changes of the direction of the AC magnetic field 250 include the inversion of the direction of the AC magnetic field 250.

Since a plane created by the current loop 210 formed by a wire for reducing interferences on the interference-source side is all but the same as the aforementioned plane created the current loop 220 formed by an inductor on the interference-source side, due to the effect of the AC magnetic field 250 generated in the direction 310, an induced current 280 flows through the current loop 210 formed by a wire for reducing interferences on the interference-source side in accordance with Lenz's law.

In accordance with Lenz's law, the direction of the induced current 280 is such a direction that a magnetic field is generated in a direction 320 of canceling a magnetic field generated on the plane cited above. An AC magnetic field is generated perpendicularly to a plane created by the current loop 240 formed by an inductor on the interfered-object side in a direction 330. In accordance with Lenz's law, an induced current 270 flows through the current loop 240 formed by an inductor on the interfered-object side whereas an induced current 290 flows through the current loop 230 formed by a wire for reducing interferences on the interfered-object side. The directions of the induced currents 270 and 290 are such directions that a magnetic field is generated in a direction 340 of canceling the AC magnetic field generated in the direction 330.

Thus, the magnetic field 320 generated by the induced current 280 and the magnetic field 340 generated by the induced current 290 reduce the magnetic field 330. As a result, the induced currents 280 and 290 reduce the induced current 270 which is an interference current generated in the inductor on the interfered-object side.

That is to say, the input current 260 becomes the induced current 270 serving as an output current through interactions by the magnetic fields 310, 250 and 330. The induced current 270 is thus a reduced propagating interference signal.

The induced current 270 is a current generated by a mutual inductance of the inductor on the interference-source side and the inductor on the interfered-object side. Thus, the wire for reducing interferences on the interference-source side and generating the induced current 280 and the wire for reducing interferences on the interfered-object side and generating the induced current 290 reduce interferences caused by the mutual inductance of the inductor on the interference-source side and the inductor on the interfered-object side.

It is to be noted that, in accordance with the principle described above, if the wire for reducing interferences is provided on only either the interference-source side or the interfered-object side, the interference reduction effect is small in comparison with a configuration in which the wire for reducing interferences is provided on each of the interference-source side and the interfered-object side. Nevertheless, even if the wire for reducing interferences is provided on only either the interference-source side or the interfered-object side, the wire does exhibit the interference reduction effect.

In the structure of the circular shield oriented in the planar-surface direction, the inductor is enclosed by a fine wire of a closed circuit. In the structure of the circular shield oriented in the planar-surface direction, an AC magnetic field generated by an AC current flowing through the inductor generates an induced current flowing through a wire of the circular shield. Then, the induced current flowing through the wire of the circular shield generates a magnetic field surrounding the circular shield. The magnetic field generated by the induced current flowing through the wire of the circular shield around the circular blocks the magnetic field generated by the inductor. Thus, it is possible to prevent inductors in close proximity to the inductor generating the magnetic field from being interfered.

To sufficiently suppress interferences, it is necessary to connect the shield to the ground so as to reduce the impedance. By making use of the close-circuit fine wire described in Patent Document 4, nevertheless, the impedance is not reduced adequately.

4: Circular Shield in the Substrate Lamination Direction

In order to solve the problem described above, in accordance with the embodiment, there is proposed a circular shield oriented in the substrate lamination direction to give a structure explained below.

As shown in the cross-sectional diagram of FIG. 1, in the circuit-substrate laminated module 1 according to the embodiment, the wiring layer of the multi-layer wiring substrate having the build-up type is designed to have a spiral shape in order to create the inductor L. The multi-layer wiring substrate having the build-up type is a substrate created as a stack of insulation and wiring layers which are piled up alternately in the base material. The spiral-shaped inductor L accommodated in the circuit-substrate laminated structure is utilized as a circuit component externally connected to the semiconductor chip 30 mounted on the surface of the second circuit substrate 20 which serves as an interposer substrate. To put it more concretely, if the semiconductor chip 30 is used as a filter circuit portion of the tuner circuit shown in the block diagram of FIG. 2, as shown in the block diagram of FIG. 3, it is necessary to provide an inductor LA on the input side of the filter circuit portion and an inductor LB on the output side of the filter circuit portion for each of the three frequency bands of the input signal. Thus, a total of six inductors are demanded for the three frequency bands. It is desirable to provide each of the six inductors as a spiral-shaped inductor which is accommodated in the circuit-substrate laminated structure as shown in the cross-sectional diagram of FIG. 1.

Reference notation L shown in the cross-sectional diagram of FIG. 1 denotes the inductor LA provided on the input side for a certain frequency band. In the surroundings of the inductor L, a circular shield SV oriented in the substrate lamination direction is created. In the cross-sectional diagram of FIG. 1, the circular shield SV oriented in the substrate lamination direction is enclosed by a dotted bold line. In the circular shield SV oriented in the substrate lamination direction, a shielding wire is included in the upper-surface wiring layer of the second circuit substrate 20.

Figures 8A, 8B:
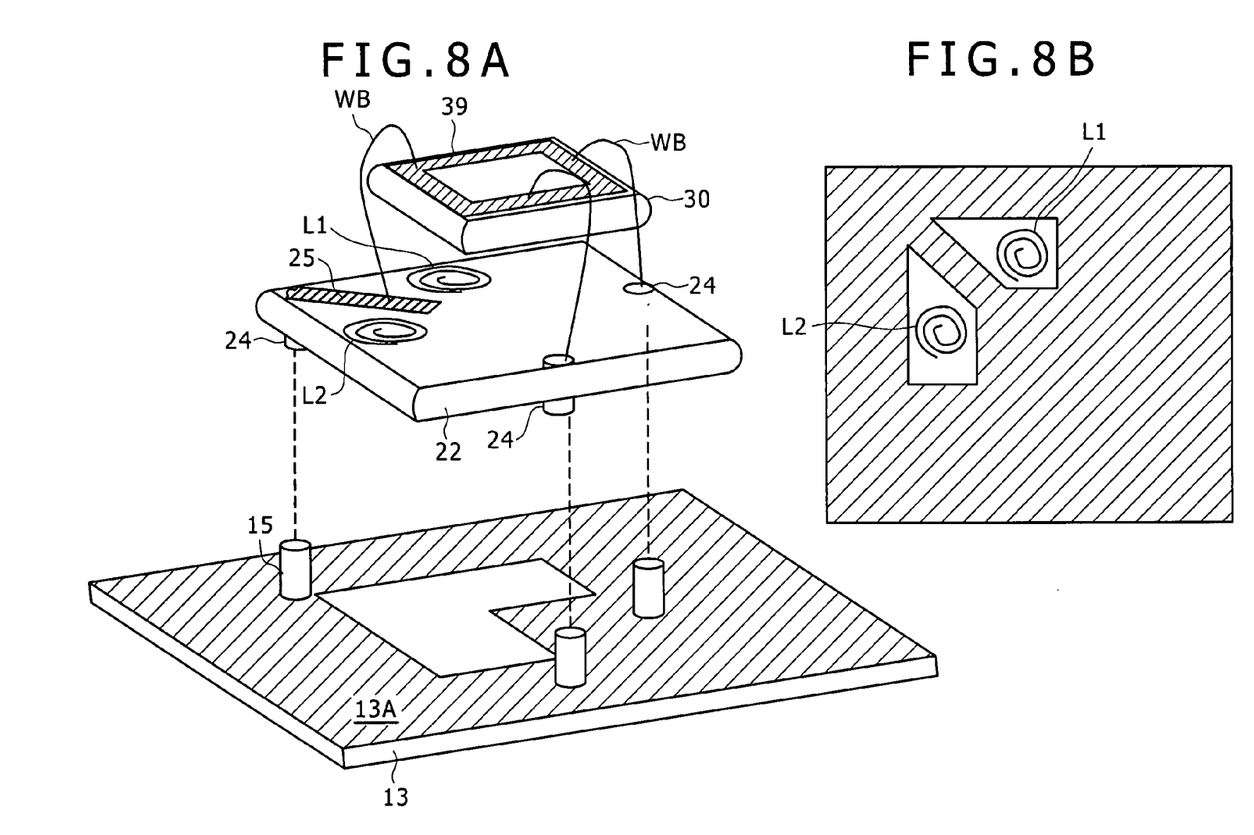
FIGS. 8A and 8B are a plurality of diagrams each showing a squint view and a top view of a portion composing a circular shield.

FIGS. 8A and 8B are a plurality of diagrams each showing a portion composing the circular shield SV. To be more specific, FIG. 8A is a diagram showing a squint view of the portion composing the circular shield SV in an easy-to-understand manner whereas FIG. 8B is a diagram showing a top view of a portion included in the circular shield SV to serve as a portion for holding the ground voltage. That is to say, FIG. 8B is a diagram showing a top view of the entire shape of a member included in the circular shield SV.

One end of the shielding wire 25 shown in the squint-view diagram of FIG. 8A is connected to a circuit ground line 39, which is created on the upper surface of the semiconductor chip 30, by adoption of typically the WB (Wire Bonding) technique. The circuit ground line 39 is connected to a ground layer of the semiconductor chip 30 at another WB (Wire Bonding) location. The ground layer of the semiconductor chip 30 is connected to a second substrate penetration via 24 in the second circuit substrate 20. As an alternative, as shown in the squint-view diagram of FIG. 8A, the WB wire used in the WB technique is connected to an upper end surface pad of the second substrate penetration via 24. In this way, the circuit ground line 39 is electrically connected to the second substrate penetration via 24 in the second circuit substrate 20 at a location which is different from the location used for connection to the shielding wire 25. In addition, it is possible to provide a configuration in which the circuit ground line 39 is electrically connected to the second substrate penetration via 24 in the second circuit substrate 20 whereas the second substrate penetration via 24 in the second circuit substrate 20 is connected to a via on the back surface of an integrated circuit within the semiconductor chip 30 that penetrates the semiconductor chip 30 in the thickness direction and by a bump to tip arrangement. Also in the case of this configuration, the circuit ground line 39 is electrically connected to the second substrate penetration via 24 in the second circuit substrate 20 at a location, which is different from the location used for connection to the shielding wire 25.

In either case, the second substrate penetration via 24 is connected to the ground layer 13A through a first substrate penetration via 15 created on the first circuit substrate 10, which is provided below the second circuit substrate 20.

The circuit ground line 39 of the semiconductor chip 30 is a wire for supplying the ground voltage to IC circuits that are some circuits of the front-end section shown in the block diagram of FIG. 2 as the front-end section of the tuner in the case of this embodiment. In the configuration, the circuit ground line 39 is connected to the wiring layer 13A through a WB wire (or penetration via in the semiconductor chip 30), the second substrate penetration via 24 and the first substrate penetration via 15. Thus, the configuration provides an optimum structure for obtaining a good IC circuit characteristic as required by a demand for a low resistance/impedance grounding structure of the IC circuits.

The circular shield in the embodiment is that the circular shield makes use of a part of the existing IC grounding structure.

On the other hand, the wiring layer 13A is connected to another second substrate penetration via 24 of the second circuit substrate 20 through another first substrate penetration via 15 created separately from the IC connection structure on the side of the semiconductor chip 30. The second substrate penetration via 24 is connected to the other end of the shielding wire 25 which is not shown in the diagram of FIG. 8B. In this way, the closed circuit serving as the circular shield for holding the ground voltage is completed.

FIGS. 7A to 7F are a plurality of pairs of diagrams showing respectively a graph representing the frequency characteristic of an inductor coupling coefficient k of a model as a characteristic, which is dependent on the type and existence/nonexistence of a circular shield for the model, and the top view of the model.

Figure 7A:
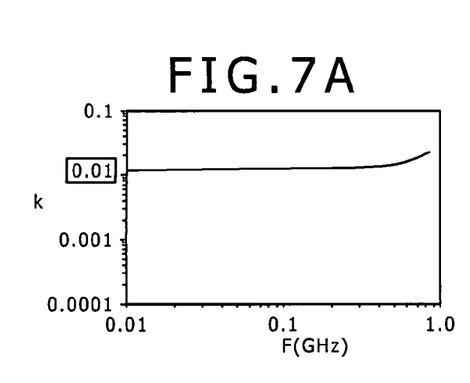
FIGS. 7A to 7F are a plurality of pairs of diagrams showing respectively a graph representing the frequency characteristic of an inductor coupling coefficient k of a model as a characteristic, which is dependent on the type and existence/nonexistence of a circular shield for the model, and the top view of the model.
Figure 7B:
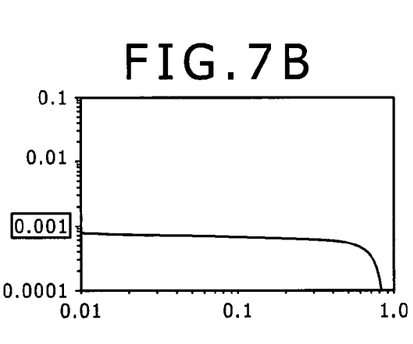
Figure 7C:
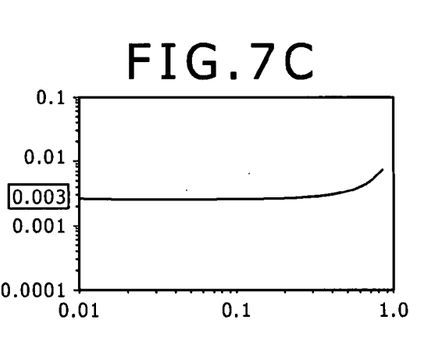
Figure 7D:
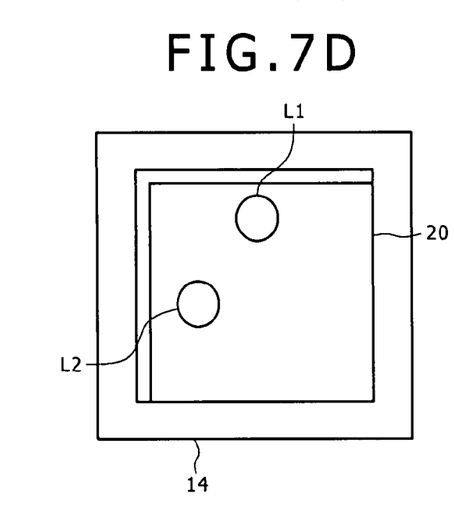
Figure 7E:
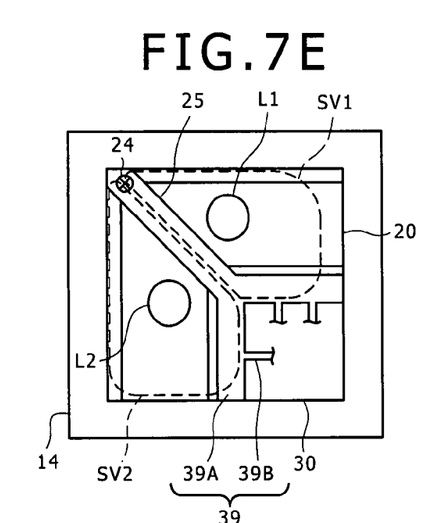

FIG. 7E is a diagram showing the top view of a model of a grounding structure for creating a circular shield oriented in the substrate lamination direction in accordance with embodiments of the present invention. By the same token, FIG. 7D is a diagram showing the top view of a first typical comparison model of a grounding structure. Likewise, FIG. 7F is a diagram showing the top view of a second typical comparison model of the grounding structure.

Figure 7F:
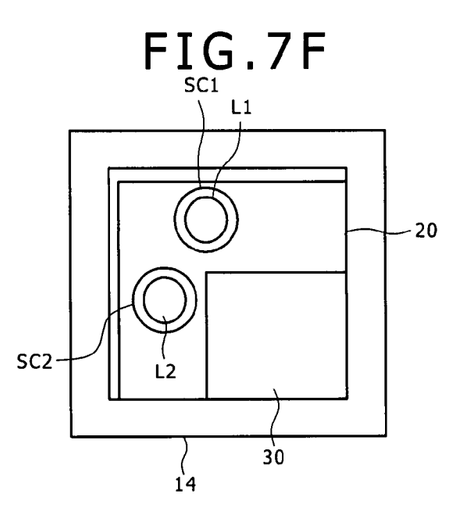

In each of the models shown in the diagrams of FIGS. 7D, 7E and 7F, the semiconductor chip 30 is implemented on the right lower corner of the second circuit substrate 20. A larger square frame enclosing the semiconductor chip 30 represents the wiring layer 13A.

A predetermined plurality of inductors L each serving as a circuit device are provided at respectively the same plurality of locations in areas surrounding the semiconductor chip 30. As shown in the block diagram of FIG. 3 showing a filter circuit portion, it is necessary to provide an inductor LA on the input side of the filter circuit portion and an inductor LB on the output side of the filter circuit portion for each of the three frequency bands of the input signal. Thus, a total of six inductors L are demanded for the three frequency bands. However, each of the models shown in the diagrams of FIGS. 7D, 7E and 7F shows only two inductors L for eliminating mutual interferences for a certain frequency band.

In case of a model shown in the model diagram of FIG. 7D to serve as the first typical comparison model of a grounding structure, only two stand-alone inductors L are used and a shield is not provided. In case of a model shown in the model diagram of FIG. 7F to serve as the second typical comparison model of a grounding structure, on the other hand, two inductors L1 and L2 are used. In addition to the two inductors L1 and L2, however, a fine wire encloses the inductor L1 to serve as a circular shield Sc1 oriented in the planar-surface direction whereas another wire encloses the inductor L2 to serve as a circular shield Sc2 also oriented in the planar-surface direction. The fine wires enclose the inductors L1 and L2 in the same way as a fine wire of a closed circuit does as described in Patent Document 4.

In case of a model shown in the model diagram of FIG. 7E to serve as a model of a grounding structure for creating a circular shield oriented in the substrate lamination direction in accordance with embodiments of the present invention, on the other hand, two inductors L1 and L2 are used and the shielding wire 25 mentioned before is created to partition an area which exists between the two inductors L1 and L2. The shielding wire 25 is created as a portion of an upper-surface wiring layer of the second circuit substrate 20. In the cross-sectional diagram of FIG. 1 showing the cross section of the inductor L1 or L2, the shielding wire 25 does not appear. One end of the shielding wire 25 is connected to the circuit ground line 39 of the second circuit substrate 20 by making use of typically a WB (Wire Bonding) wire whereas the other end of the shielding wire 25 is extended an edge of the second circuit substrate 20. On the edge of the second circuit substrate 20, a plurality of second substrate penetration vias 24 are normally provided. At least one of the second substrate penetration vias 24 are connected to the shielding wire 25.

As described before, on the other hand, the semiconductor chip 30 adopts a grounding structure peculiar to the semiconductor chip 30.

In this embodiment, on the surface of the semiconductor chip 30, a trunk line 39A of the circuit ground line 39 surrounding the surface over the edges of the surface is provided.

In addition, a branch line 39B of the circuit ground line 39 is also provided on the surface of the semiconductor chip 30. Extended from the trunk line 39A to the inside of the semiconductor chip 30, the branch line 39B is used for supplying the ground voltage to every circuit block inside the semiconductor chip 30.

Each of the trunk line 39A and the branch line 39B is properly connected to the BGA of the lower surface of the semiconductor chip 30 through a penetration via in the semiconductor chip 30 so as to provide a connection structure for sharing the ground voltage with the second circuit substrate 20. In particular, in a semiconductor chip 30 intended for high-frequency applications, the internal ground-voltage connection path is designed to have a low impedance.

It is to be noted that, as explained earlier, in some configurations, the circuit ground line 39 is connected electrically to the second substrate penetration via 24 through another WB (Wire Bonding) wire in place of a chip internal penetration via. As a matter of fact, such a configuration is rather the basic connection implementation. In some cases, the chip internal penetration via cannot be used. If the chip internal penetration via can be utilized, however, the use of the chip internal penetration via is desirable for reduction of the impedance.

The model diagram of FIG. 7E shows each of the circular shields Sv1 and Sv2 oriented in the substrate lamination direction as a block enclosed by a dashed bold line. The path of each of the circular shields Sv1 and Sv2 is determined so as to result in a path having a smallest impedance in the semiconductor chip 30. Thus, paths of the two circular shields Sv1 and Sv2 are created on respectively the left and right sides of the shielding wire 25, which is spilt into two branches.

As described earlier, FIG. 7B is a diagram showing a graph representing a frequency characteristic, which is a relation between the inductor coupling coefficient k and the frequency, for a structure according to embodiments of the present invention. On the other hand, FIG. 7A is a diagram showing a graph representing the frequency characteristic for the first typical comparison model whereas FIG. 7C is a diagram showing a graph representing a frequency characteristic for the second typical comparison model.

By comparison of the three frequency characteristics, as shown in the diagram of FIG. 7A, it is obvious that the inductor coupling coefficient k of the first typical comparison model with a shield not created at all is about 0.01 which is the highest inductor coupling coefficient k among the three inductor coupling coefficients k of the first typical comparison model, the structure according to embodiments of the present invention and the second typical comparison model respectively. The inductor coupling coefficient k of the second typical comparison model shown in the diagram of FIG. 7C is about 0.003 which is much lower than the value of 0.01. However, this inductor coupling coefficient k of 0.003 for the second typical comparison model is still higher than the target inductor coupling coefficients, which are not greater than 0.001 as described earlier by referring to the diagram of FIG. 4.

As shown in the frequency-characteristic diagram of FIG. 7B provided for the structure according to embodiments of the present invention, on the other hand, the inductor coupling coefficient k is about 0.001 which sufficiently lowers the mutual inductance. It is to be noted that the inductor coupling coefficient k for the structure according to embodiments of the present invention is about 0.001 without regard to whether a chip internal penetration via is utilized or a connection path making use of a WB wire is utilized.

As is obvious from the above description, the circular shield oriented in the substrate lamination direction is provided in accordance with the embodiment in which the two ends of the shielding wire 25 are connected to the wiring layer 13A by making use of the grounding structure of the semiconductor chip 30, and the circular shield is very effective for eliminating interferences among inductors.

In the case of the second typical comparison model, on the other hand, the circular shield created in the form of a conductive layer incurs a large eddy-current loss at locations close to inductors and gives a high ground voltage connection impedance. Thus, even though the second typical comparison model exhibits an effect of eliminating interferences among the inductors, the effect is not adequate.

In addition, in the structure provided by embodiments of the present invention as shown in the model diagram of FIG. 7E, the shielding wire 25 is merely added in an available space between the inductors and the two ends of the shielding wire 25 are merely connected to the wiring layer 13A by adoption of the connection technique explained above. Since such an available space normally exists anyway between the inductors and can be used as a space for eliminating interferences among the inductors, there is no area increase caused by adoption of the structure provided by embodiments of the present invention and, even if there is such an area increase, the area increase is small.

In the case of the second typical comparison model, on the other hand, fine wires enclosing the inductors L in the same way as a fine wire of a closed circuit does substantially reduce the area increase. Since the reduction of the inductor coupling coefficient k is nor adequate, however, a countermeasure needs to be taken. A typical example of the countermeasure is further separation of the inductors L from each other. In the case of such a countermeasure, however, the area increase cannot be avoided.

It is to be noted that the two inductors L separated from each other by the shielding wire 25 operate at the same time. If the two inductors L do not operate at the same time, mutual interferences hardly occur. As shown in the block diagram of FIG. 3 showing a filter circuit portion, the two inductors are an inductor LA provided on the input side of the filter circuit portion and an inductor LB provided on the output side of the filter circuit portion for each of the three frequency bands of the input signal. Thus, in the case of such a filter circuit portion, the shield structure making use of the shielding wire 25 is useful for eliminating mutual interferences between the inductors LA and LB.

It is also worth noting that, as also commonly known, the lower frequency of currents flowing through inductors, the larger the gap demanded for separating the inductors from each other. The number of shielding wires 25 and the location of each of the shielding wires 25 are determined from the following two points of view. The first point of view is a standpoint that, the lower frequency of currents flowing through inductors, the larger the gap demanded for separating the inductors from each other. The second point of view is a standpoint that it is necessary to separate inductors which operate at the same time.

In addition, in the second typical comparison model shown in the diagram of FIG. 7F and the structure provided by embodiments of the present invention as shown in the diagram of FIG. 7E, the semiconductor chip 30 is placed at a corner of the second circuit substrate 20. However, the location of the semiconductor chip 30 is by no means limited to a corner. If approximately six inductors L are used, nevertheless, by placing the semiconductor chip 30 at a corner on the upper surface of the second circuit substrate 20, it becomes easy to secure a space at which the inductors are to be provided. If more inductors L are used, that is, if approximately 10 inductors L are used for example, by placing the semiconductor chip 30 at the center on the upper surface of the second circuit substrate 20, the inductors L can be provided at locations by making use of the space of the locations with a higher degree of efficiency.

In addition, the circuit device does not have to be an inductor. For example, the circuit device can be an oscillator, a filter, a matching circuit or a modulation circuit. In this case, each of the oscillator, the filter, the matching circuit and the modulation circuit may employ inductors, capacitors and registers.

The shielding wire 25 can also be created by making use of a hierarchical wiring layer other than the highest-level hierarchical layer of the second circuit substrate 20. In addition, if an inductor L makes use of a plurality of wiring layers in the layer hierarchy, the shielding wire 25 may be provided on each of the wiring layers in the layer hierarchy. In such a configuration, the shielding wires 25 provided on different wiring layers in the layer hierarchy may be connected to each other by making use of second substrate penetration vias 24 so that the shielding wires 25 are set at the same electric potential.

5: Typical Product Serving as an Application

Figure 9:
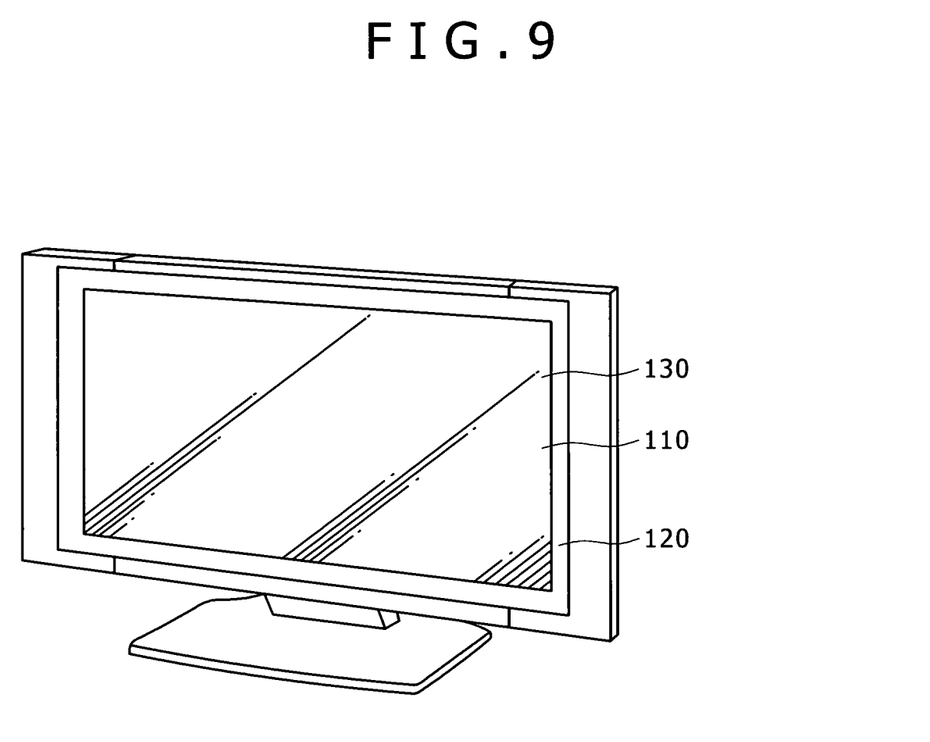
FIG. 9 is a diagram showing a TV to which embodiments of the present invention is applied.

The structure described above can be applied to a television display apparatus shown in a squint-view diagram of FIG. 9 and any other electronic apparatus that particularly has a tuner embedded therein. In the following description, the television display apparatus is also referred to as a TV. The following description explains a TV which is a representative example of electronic apparatus to which embodiments of the present invention can be applied.

FIG. 9 is a diagram showing a TV to which embodiments of the present invention is applied. The TV according to an embodiment of the present invention employs a video display screen section 110 which is configured to include a front panel 120 and a filter glass 130. Embodiments of the present invention can be applied to a printed wiring board in the case (that is, the cabinet) of the TV or a module plate mounted on the board. The printed wiring board and the module plate themselves are not shown in the squint-view diagram of FIG. 9.

As described before, it is possible to suppress interferences among circuits of high-frequency components mounted on an interposer which is laid on a mother board. The interposer corresponds to the second circuit substrate 20 of the circuit-substrate laminated module whereas the mother board corresponds to the first circuit substrate 10 of the circuit-substrate laminated module. In order to eliminate the interferences, for each circuit device serving as one of the high-frequency components, the impedance can be reduced by forming a circular shield oriented in the substrate lamination direction. In order to apply embodiments of the present invention to a circuit-substrate laminated module or an electronic apparatus employing the circuit-substrate laminated module, it is unnecessary to increase the size of an area which is to be occupied by the circuit-substrate laminated module. Even if the size of an area to be occupied by the circuit-substrate laminated module must be increased, the size of the SiP can be reduced due to the small circuit-substrate laminated module.

The present application contains subject matter related to that disclosed in Japanese Priority Patent Application JP 2009-296070 filed in the Japan Patent Office on Dec. 25, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A device, comprising:
   a plurality of circuit elements on a substrate;
   a shielding element between at least two of the plurality of circuit elements; and
   a bonding element that electrically connects the shielding element to a grounding circuit of a semiconductor chip that is on the substrate, wherein an additional bonding element electrically connects the grounding circuit of the semiconductor chip to an additional substrate through a via in the semiconductor chip and a via in the substrate.

2. The device of claim 1, wherein a second additional bonding element electrically connects the grounding circuit to the additional substrate through a second via in the semiconductor chip and a second via in the substrate.

3. The device of claim 1, wherein the bonding element physically connects to the grounding circuit is a different location than where the additional bonding element physically connects to the grounding circuit.

4. A device, comprising:
   a plurality of circuit elements on a substrate;
   a shielding element between at least two of the plurality of circuit elements; and
   a bonding element that electrically connects the shielding element to a grounding circuit of a semiconductor chip that is on the substrate, wherein the grounding circuit of the semiconductor chip is on a surface of the semiconductor chip and borders the edges of the surface.

5. The device of claim 4, wherein the grounding circuit of the semiconductor chip, comprises:
   a trunk line that borders the surface of the semiconductor chip; and
   a branch line that electrically connects the grounding circuit to a plurality of circuit elements in the semiconductor chip.

6. The device of claim 5, wherein the bonding element physically connects to the trunk line of the grounding circuit,
   wherein the branch line branches from trunk line,
   wherein the semiconductor chip comprises:
      an integrated circuit that has an internal via connected to the branch line,
   wherein the internal via has an end surface on a side of the semiconductor chip opposite to the a side of the semiconductor chip with the grounding circuit,
   wherein a via in the substrate connects to the end surface of an internal via through a bump to tip arrangement.

7. A device, comprising:
   a plurality of circuit elements on a substrate;
   a shielding element between at least two of the plurality of circuit elements; and
   a bonding element that electrically connects the shielding element to a grounding circuit of a semiconductor chip that is on the substrate,
   wherein the shielding element electrically forms a circular shield,
   wherein the circular shield is formed in a direction normal to a plane constructed by the at least two of the plurality of circuit elements.

8. A device, comprising:
   a plurality of circuit elements on a substrate;
   a shielding element between at least two of the plurality of circuit elements; and
   a bonding element that electrically connects the shielding element to a grounding circuit of a semiconductor chip that is on the substrate,
   wherein at least one of the circuit elements is an inductor,
   wherein the inductor is a coil line pattern created in a wiring layer of the substrate.

9. A device, comprising:
   a plurality of circuit elements on a substrate;
   a shielding element between at least two of the plurality of circuit elements; and
   a bonding element that electrically connects the shielding element to a grounding circuit of a semiconductor chip that is on the substrate,
   wherein at least one of the circuit elements is an inductor,
   wherein the inductor is a plurality of coil line patterns created in a plurality of wiring layers of the substrate connected by though holes in the substrate.

10. A device, comprising:
    a plurality of circuit elements on a substrate;
    a shielding element between at least two of the plurality of circuit elements; and
    a bonding element that electrically connects the shielding element to a grounding circuit of a semiconductor chip that is on the substrate, wherein the shielding element is a shielding wire.

11. A device, comprising:
    a plurality of circuit elements on a substrate;
    a shielding element between at least two of the plurality of circuit elements; and
    a bonding element that electrically connects the shielding element to a grounding circuit of a semiconductor chip that is on the substrate, wherein the bonding element is a bonding wire.

12. A tuning circuit, comprising:
    a front-end integrated chip that comprises of at least one of a filter amplifier pair,
    wherein the filter amplifier pair comprises:
       a band pass filter; and
       a radio frequency amplifier; and
    a device, comprising:
       a plurality of circuit elements on a substrate;
       a shielding element between at least two of the plurality of circuit elements; and
       a bonding element that electrically connects the shielding element to a grounding circuit of a semiconductor chip that is on the substrate.

13. An electronic apparatus, comprising:
    a device, comprising:
       a plurality of circuit elements on a substrate;
       a shielding element between at least two of the plurality of circuit elements; and
    a bonding element that electrically connects the shielding element to a grounding circuit of a semiconductor chip that is on the substrate, wherein the electronic apparatus is a display device.

14. The electronic apparatus of claim 13, wherein the display device is a TV.

15. An electronic apparatus, comprising:
    a device, comprising:
       a plurality of circuit elements on a substrate;
       a shielding element between at least two of the plurality of circuit elements; and
       a bonding element that electrically connects the shielding element to a grounding circuit of a semiconductor chip that is on the substrate; and
    tuning circuit, comprising:

a front-end integrated chip that includes the devices and that comprises of at least one of a filter amplifier pair,
wherein the filter amplifier pair comprises a band pass filter and a radio frequency amplifier.

* * * * *